(12) United States Patent
Wu et al.

(10) Patent No.: US 9,885,104 B2
(45) Date of Patent: Feb. 6, 2018

(54) METHOD FOR ELIMINATING MASK SELF-MAGNETIZATION, SUBSTRATE MANUFACTURING METHOD AND MASK TESTING DEVICE

(71) Applicants: BOE TECHNOLOGY GROUP CO., LTD., Beijing (CN); ORDOS YUANSHENG OPTOELECTRONICS CO., LTD., Ordos (CN)

(72) Inventors: Yan Wu, Beijing (CN); Yuedong Shang, Beijing (CN); Yongkai Wu, Beijing (CN); Jianbin Feng, Beijing (CN); Guoping Zhang, Beijing (CN); Junyu Li, Beijing (CN); Bo Zhang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 245 days.

(21) Appl. No.: 14/744,543

(22) Filed: Jun. 19, 2015

(65) Prior Publication Data
US 2016/0268175 A1    Sep. 15, 2016

(30) Foreign Application Priority Data
Mar. 10, 2015    (CN) .......................... 2015 1 0104512

(51) Int. Cl.
*C23C 14/04*    (2006.01)
*H01L 51/00*    (2006.01)

(52) U.S. Cl.
CPC ........ *C23C 14/042* (2013.01); *H01L 51/0011* (2013.01)

(58) Field of Classification Search
CPC .... C23C 14/042; H01L 22/20; H01L 51/0011
See application file for complete search history.

(56) References Cited

U.S. PATENT DOCUMENTS 6,600,162 B1 * 7/2003 Hahmann ............... B82Y 10/00
250/310

FOREIGN PATENT DOCUMENTS

| CN | 1291660 A | 4/2001 |
| CN | 102720003 A | 10/2012 |

OTHER PUBLICATIONS

Machine Translation of Liu et. al., CN 1027220003, cited in Applicant's IDS.*
First Office Action regarding Chinese application No. 201510104512.7, dated Oct. 17, 2016. Translation provided by Dragon Intellectual Property Law Firm.

* cited by examiner

*Primary Examiner* — Bilkis Jahan
*Assistant Examiner* — Victor Barzykin
(74) *Attorney, Agent, or Firm* — Harness, Dickey & Pierce, P.L.C.

(57) ABSTRACT

Disclosed are a method for eliminating self-magnetization of a mask, a method for manufacturing a substrate and a mask testing device. The mask may include a plurality of metal stripes spaced from each other. The method may include a step of: energizing the mask, so as to enable the plurality of metal stripes to carry like charges, thereby separating every metal stripe from other adjacent metal stripes bonded together.

13 Claims, 4 Drawing Sheets

METHOD FOR ELIMINATING MASK SELF-MAGNETIZATION, SUBSTRATE MANUFACTURING METHOD AND MASK TESTING DEVICE

CROSS-REFERENCE TO RELATED APPLICATION

The present application claims a priority of the Chinese patent application No. 201510104512.7 filed on Mar. 10, 2015, which is incorporated herein by reference in its entirety.

FIELD OF THE INVENTION

The present disclosure relates to a field of display technology, in particular to a method for eliminating mask self-magnetization, a method for manufacturing a substrate and a mask testing device.

DESCRIPTION OF THE PRIOR ART

An EV Mask is one of most advanced display techniques applied in semi-conductor display industry and is also one important process during Active-Matrix Organic Light Emitting Diode (AMOLED) evaporation process. According to different functions, the EV Mask can be divided into a Fine Metal Mask (FMM) and an Open/Common Mask; On the other hand, according to different pixel design categories, the EV Mask can also be divided into a Slot Mask and a Stripe Mask.

During AMOLED product evaporation process, how to reduce or even eliminate EV Mask defects is the key to better adapt to fast development of AMOLED industry. A material for FMMs consists of INVAR (36% Ni—Fe) as components, namely a kind of ferro-magnetic material having a low resistance, which is prone to self-magnetization. Within FMMs, after its magnetization, adjacent (neighboring) metal stripes are inclined to be bonded together. Conventionally, it is necessary to test the FMM mask prior to transferring it into an evaporation chamber. Specifically sections with defects can be found after Charge Couple Device (CCD) imaging by a mask testing device. In the condition that adjacent metal stripes have been bonded which is found by the mask testing device after CCD imaging, the bonded sections are blown separate and apart by a build-in blower within the mask testing device. If the bonded sections can be blown separate and apart, then the mask is to be transferred into the evaporation chamber; As opposed to it, if the bonded sections cannot be blown separate and apart, then the mask is to be taken away from the testing device. As an alternative, it is necessary to adopt a tension air gun to blow the bonded sections separate and apart, and then transfer the mask back to the mask testing device for further testing. If there is no more bonding for the mask, then the mask is transferred to the evaporation chamber; however if there still exists certain bonding between mask metal stripes, then it is necessary to weld a new FFM Mask. As it is seen that the above process is quite time-consuming, because if the built-in blower cannot blow the bonded sections separate and apart, not only the mask has to be taken out of the testing device and be subject to further blowing by a tension air gun, but also the mask has to be transferred back to the testing device to confirm whether the bonded sections have been blown separate and apart. Therefore the above process is both time-consuming and labor-intensive.

Furthermore, during the process of transferring the FFM mask to the evaporation chamber, the bonded sections that have been blown separate and apart by the built-in blower or the tension air gun, when being subject to external vibration, are inclined to be bonded again. Therefore, in real evaporation process, EV mask is defective, which significantly reduces AMOLED product yield and increases manufacturing cost.

SUMMARY OF THE INVENTION

The technical problem to be solved is how to effectively eliminate the bondage of adjacent metal stripes, in the evaporation process for manufacturing light emitting diodes (LEDs).

In order to achieve the above objective, disclosed by the present disclosure are a method for eliminating self-magnetization of a mask, a method for manufacturing a substrate and a mask testing device.

In an aspect of the present disclosure, a method for eliminating self-magnetization of a mask is provided. The mask may include a plurality of metal stripes spaced from each other. The method may include a step of: energizing the mask, so as to enable the plurality of metal stripes to carry like charges, thereby separating adjacent metal stripes that have been bonded together.

Alternatively, the method may include a pre-testing step. And the pre-testing step may include: testing whether or not there are adjacent metal stripes bonded together; if yes, energizing the mask; and if not, not energizing the mask.

Alternatively, the method may include a post-energization testing step. And the post-energization testing step may include: testing whether or not there are adjacent metal stripes bonded together; if yes, continuing to energize the mask; and if not, stopping energizing the mask.

Alternatively, the method may further include a step of eliminating charges on the mask.

Alternatively, the step of eliminating charges on the mask may include connecting the mask to the ground.

In another aspect of the present disclosure, a method for manufacturing a Light Emitting Diode (LED) substrate, which may include a step of eliminating self-magnetization of a mask described above.

In yet another aspect of the present disclosure, a mask testing device is provided. The mask testing device may include an imaging device and a mask self-magnetization eliminating device. The imaging device may be configured to form an image of a mask to be tested, detect whether or not there are adjacent metal stripes bonded together, and transmit a test result to the mask self-magnetization eliminating device. And the mask self-magnetization eliminating device may be configured to energize the mask based on the test result, so as to enable the plurality of metal stripes to carry like charges, thereby separating adjacent metal stripes that have been bonded together.

Alternatively, the mask self-magnetization eliminating device may include a power source configured to energize the mask to be tested.

Alternatively, the mask self-magnetization eliminating device may include a grounding device.

According to the method for eliminating mask self-magnetization, the substrate manufacturing method, and the mask testing device, adjacent metal stripes that are bonded can be separated from each other according to a principle that like charges repel each other, after the mask having adjacent metal stripes bonded together carries certain charges. The present disclosure can be applied in the mask testing device, such that a time period for the mask testing device to find mask defects can be reduced. Besides, the present disclosure can also be applied in the evaporation equipment so as to prevent the mask from having its metal stripes bonded again due to vibration caused on the way of transfer. Therefore, in real manufacturing process, the occurrence of defectiveness in EV Mask can be reduced, which significantly improves AMOLED product yield and reduces manufacturing cost.

BRIEF DESCRIPTION OF THE DRAWINGS

In order to illustrate embodiments of the present disclosure or technical solutions in the prior art more clearly, drawings to be used for description of the embodiments or the prior art will be introduced briefly. Obviously, the following drawings only show some embodiments of the present disclosure. The skilled in the art may also obtain other drawings based on these drawings without any creative labor.

DETAILED DESCRIPTION OF THE PREFERRED EMBODIMENTS

Embodiments of the present disclosure are further described in conjunction with the drawings and examples hereinafter. The following examples are only for describing the present disclosure, and not meant to limit the scope of the present disclosure.

To make the objects, solutions and advantages of the present disclosure more obvious, technical solutions of the embodiments of the present disclosure will be illustrated in detail in the following in conjunction with the drawings of the embodiments. Apparently, the described embodiments are only some but not all of the embodiments of the present disclosure. All the other embodiments obtained by those skilled in the art based on the described embodiments of the present disclosure fall within the scope of protection of the present disclosure.

Technical terms or scientific terms used here should have a common meanings understood by those ordinary skilled in the art. Words such as "first" and "second" used in the specification and the claims of this patent application do not indicate any order, quantity or importance, and are only used to distinguish different components, unless defined otherwise. Similarly, words such as "one" and "a/an" do not indicate any numeral limitation either, but at least one existing. Words such as "connected to" or "connected with" do not limited to physical or mechanical connection necessarily, but can include electrical connection, either direct or indirect. Words such as "upper", "lower", "left" and "right" only used to indicate the relative position relation, and if the absolute position of the described object changes, the relative position relation changes accordingly.

Figure 1:
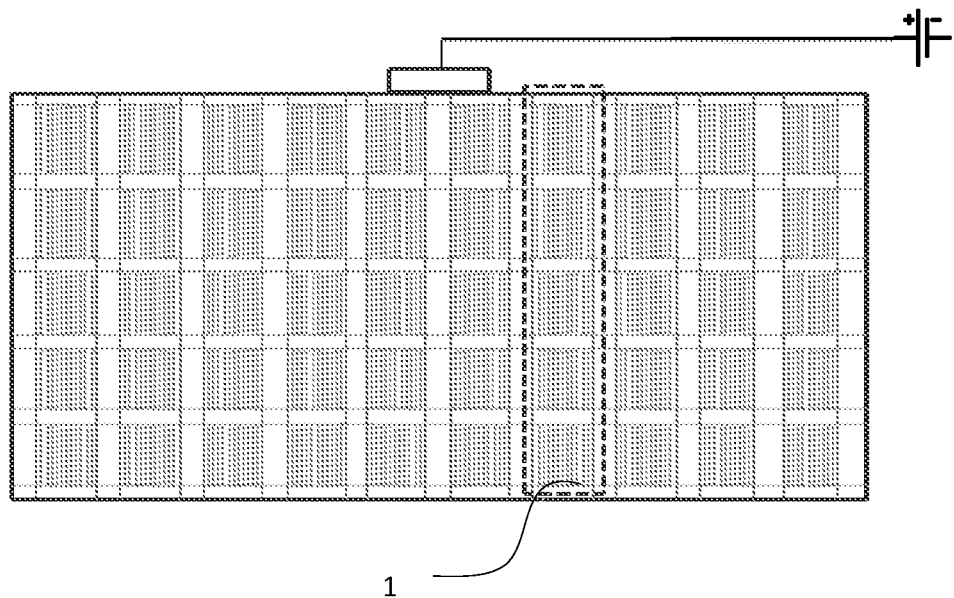
FIG. 1 is a diagram illustrating how a mask is connected to a power source according to the present disclosure.

As shown in FIG. 1, the present disclosure provides a method for eliminating self-magnetization of a mask, which may include a plurality of metal stripes spaced from each other. The method may include a step of: energizing the mask, so as to enable the plurality of metal stripes to carry like charges, thereby separating adjacent metal stripes that have been bonded together. The detailed description of the above method will be given below.

Figure 2:
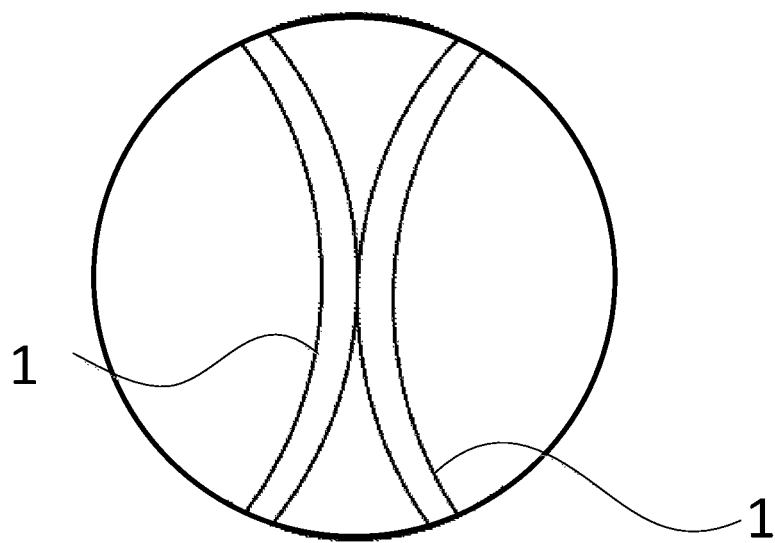
FIG. 2 is a diagram illustrating how adjacent metal stripes of the mask are bonded together according to the present disclosure.
Figure 3:
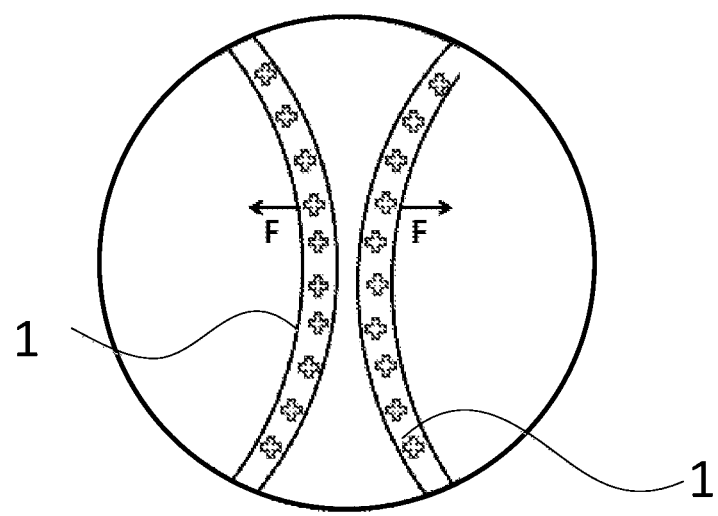
FIG. 3 is a diagram illustrating the adjacent metal stripes of the mask having charges according to the present disclosure.
Figure 4:
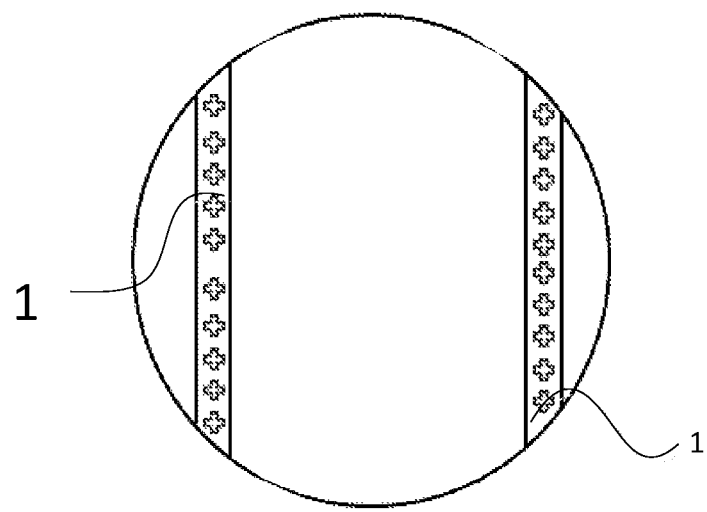
FIG. 4 is a diagram illustrating how the bonded adjacent metal stripes of the mask are separated according to the present disclosure.

In one embodiment of the present disclosure, it is to test the FMM mask prior to transferring it into an evaporation chamber. Specifically sections with defects can be found after Charge Couple Device (CCD) imaging by a mask testing device. As shown in FIG. 2, when the mask testing device finds that adjacent metal stripes of the mask are bonded together by CCD imaging of the mask, as shown in FIG. 1, the mask is energized. After the energizing, as shown in FIG. 3, metal stripes of the mask carry like charges. The bonded metal stripes can be separated, as shown in FIG. 4, due to the fact that like charges repel each other, when charged metal stripes are under the effect of charges. Within the step of testing whether or not there are adjacent metal stripes of the mask are bonded, if yes, then continue to energize the mask; if not (including a case that those bonded metal stripes have been separated after energizing), then stop energizing the mask. On the other hand, within the step of testing whether or not there are adjacent metal stripes of the mask are bonded, if not, the mask may be not energized.

Figure 5:
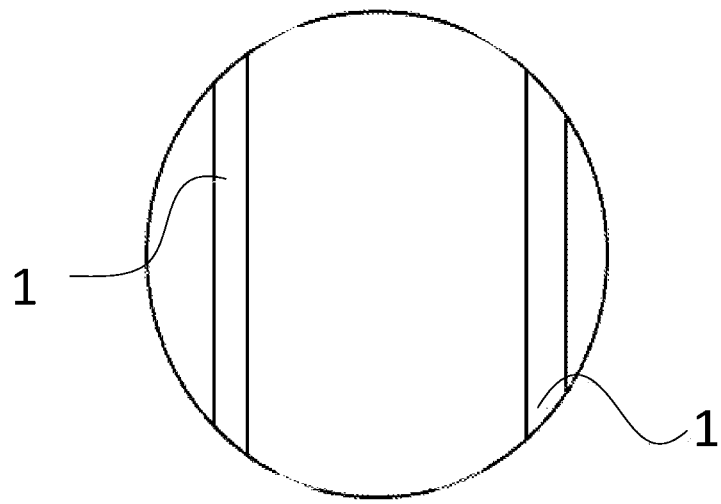
FIG. 5 is a diagram illustrating the metal stripes of the mask after eliminating charges according to the present disclosure.
Figure 6:
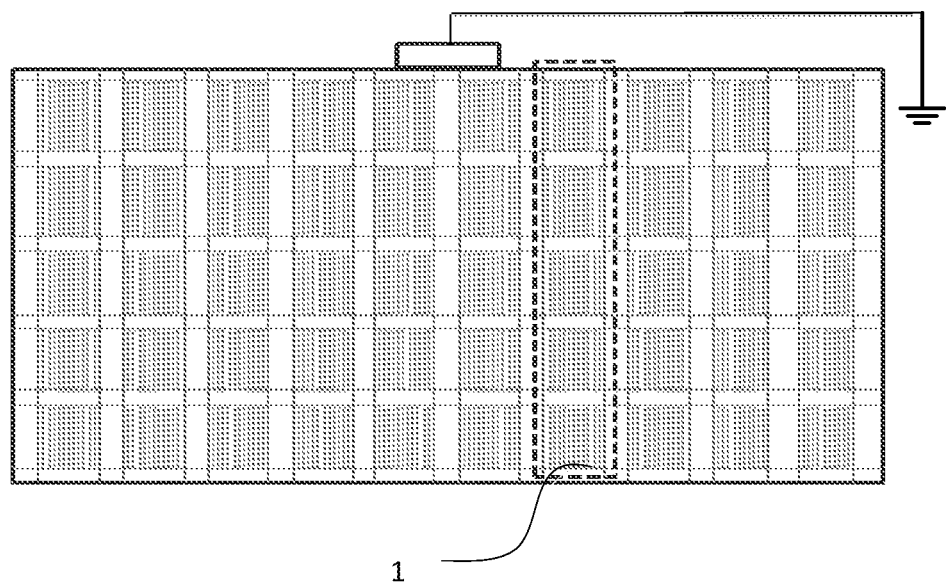
FIG. 6 is a diagram illustrating how to ground the mask according to the present disclosure.

As shown in FIG. 4, after adjacent metal stripes of the mask bonded together have been separated apart, the mask still carries a great deal of charges. In order to avoid that charges may impose adverse impact on further evaporation process, it is necessary to eliminate (remove) charges left on the mask. The mask after charge elimination is shown in FIG. 5. Alternatively, as shown in FIG. 6, the mask may be connected to the ground for the purpose of eliminating charges left on the mask.

In order to further illustrate superiority with respect to the method for eliminating mask self-magnetization provided by the present disclosure, an LED substrate manufacturing method is also provided by the present disclosure, which may include a step of eliminating mask self-magnetization described above.

Figure 7:
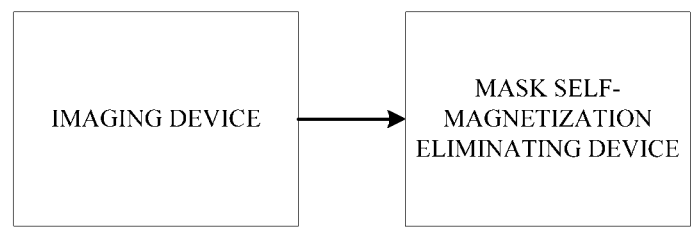
FIG. 7 is a block diagram illustrating a mask testing device according to the present disclosure.
Figure 8:
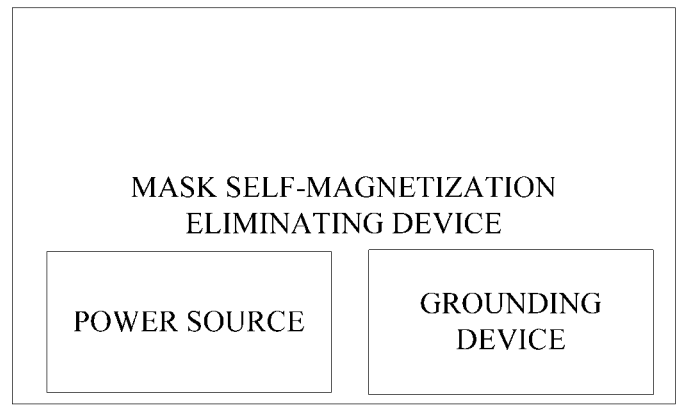
FIG. 8 is a block diagram illustrating a mask self-magnetization eliminating device.

In order to further illustrate superiority with respect to the method for eliminating mask self-magnetization provided by the present disclosure, a mask testing device which applies the above method is also provided by the present disclosure. As shown in FIG. 7, the mask testing device may include an imaging device and a mask self-magnetization eliminating device. The imaging device is configured to form an image of a mask to be tested, detect whether or not there are adjacent metal stripes bonded together, and transmit a test result to the mask self-magnetization eliminating device. The mask self-magnetization eliminating device is configured to energize the mask, so as to enable the plurality of metal stripes to carry like charges, thereby separating adjacent metal stripes that have been bonded together. As shown in FIG. 8, the mask self-magnetization eliminating device may include a power source configured to energize the mask to be tested and a grounding device. The mask self-magnetization eliminating device enables metal stripes of the mask to carry like charges, after having the mask connected with the power source. The bonded metal stripes can be separated, due to the fact that like charges repel each other, when charged metal stripes are under the effect of charges. Besides, the mask self-magnetization eliminating device enables the mask to eliminate charges by the grounding device, so as to prevent subsequent evaporation process from being affected by the charges.

Therefore, according to the method for eliminating mask self-magnetization, the substrate manufacturing method, and the mask testing device, adjacent metal stripes that are bonded can be separated from each other according to a principle that like charges repel each other, after the mask having adjacent metal stripes bonded together carries certain charges. The present disclosure can be applied in the mask testing device, such that a time period for the mask testing device to find mask defects can be reduced. Besides, the present disclosure can also be applied in the evaporation equipment so as to prevent the mask from having its metal stripes bonded again due to vibration caused on the way of transfer. Therefore, in real manufacturing process, the occurrence of defectiveness in EV Mask can be reduced, which significantly improves AMOLED product yield and reduces manufacturing cost.

The above are merely the preferred embodiments of the present disclosure. It should be appreciated that, a person skilled in the art may make further improvements and modifications without departing from the principle of the present invention, and these improvements and modifications shall also be considered as the scope of the present invention.

What is claimed is:

1. A method for eliminating a defect of a mask caused by self-magnetization, the mask comprising a plurality of metal stripes spaced from each other, the method comprising a step of:
    energizing the mask to enable the plurality of metal stripes to carry like charges, thereby separating adjacent metal stripes that have been bonded together.

2. The method according to claim 1, further comprising a pre-testing step, wherein the pre-testing step comprises:
    testing whether or not there are adjacent metal stripes bonded together;
    if yes, energizing the mask; and
    if not, not energizing the mask.

3. The method according to claim 1, further comprising a post-energization testing step, wherein the post-energization testing step comprises:
    testing whether or not there are adjacent metal stripes bonded together;
    if yes, continuing to energize the mask; and
    if not, stopping energizing the mask.

4. The method according to claim 1, further comprising a step of eliminating charges on the mask.

5. The method according to claim 4, wherein the step of eliminating charges on the mask comprises connecting the mask to the ground.

6. A method for manufacturing a Light Emitting Diode (LED) substrate, comprising a step of eliminating a defect of a mask caused by self-magnetization before evaporation, wherein the mask comprises a plurality of metal stripes spaced from each other, the step of eliminating self-magnetization of a mask comprises a step of:
    energizing the mask to enable the plurality of metal stripes to carry like charges, thereby separating adjacent metal stripes that have been bonded together.

7. The method according to claim 6, wherein the step of eliminating a defect of a mask caused by self-magnetization further comprises a pre-testing step, wherein the pre-testing step comprises:
    testing whether or not there are adjacent metal stripes bonded together;
    if yes, energizing the mask; and
    if not, not energizing the mask.

8. The method according to claim 6, wherein the step of eliminating a defect of a mask caused by self-magnetization further comprises a post-energization testing step, wherein the post-energization testing step comprises:
    testing whether or not there are adjacent metal stripes bonded together;
    if yes, continuing to energize the mask; and
    if not, stopping energizing the mask.

9. The method according to claim 6, wherein the step of eliminating a defect of a mask caused by self-magnetization further comprises a step of eliminating charges on the mask.

10. The method according to claim 9, wherein the step of eliminating charges on the mask comprises connecting the mask to the ground.

11. A mask testing device, which comprises an imaging device and a mask self-magnetization-caused defect eliminating device;
    wherein the imaging device is configured to form an image of a mask to be tested, detect whether or not there are adjacent metal stripes bonded together, and transmit a test result to the mask self-magnetization-caused defect eliminating device; and
    wherein the mask self magnetization-caused defect eliminating device is configured to energize the mask based on the test result to enable the plurality of metal stripes to carry like charges to separate adjacent metal stripes that have been bonded together.

12. The mask testing device according to claim 11, wherein the mask self-magnetization-caused defect eliminating device comprises a power source configured to energize the mask to be tested.

13. The mask testing device according to claim 11, wherein the mask self-magnetization-caused defect eliminating device comprises a grounding device.

* * * * *